United States Patent
Mandl et al.

(10) Patent No.: US 10,608,081 B2
(45) Date of Patent: Mar. 31, 2020

(54) METHOD FOR LATERAL PATTERNING OF A PATTERN LAYER WITH THREE-DIMENSIONAL PATTERN ELEMENTS, AND SEMICONDUCTOR DEVICE

(71) Applicant: OSRAM Opto Semiconductors GmbH, Regensburg (DE)

(72) Inventors: Martin Mandl, Lappersdorf (DE); Tilman Schimpke, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/312,169

(22) PCT Filed: May 19, 2015

(86) PCT No.: PCT/EP2015/060972
§ 371 (c)(1),
(2) Date: Nov. 17, 2016

(87) PCT Pub. No.: WO2015/177131
PCT Pub. Date: Nov. 26, 2015

(65) Prior Publication Data
US 2017/0092719 A1    Mar. 30, 2017

(30) Foreign Application Priority Data
May 21, 2014   (DE) .................. 10 2014 107 167

(51) Int. Cl.
*H01L 29/06* (2006.01)
*H01L 21/304* (2006.01)
(Continued)

(52) U.S. Cl.
CPC ........ *H01L 29/0657* (2013.01); *H01L 21/304* (2013.01); *H01L 21/3083* (2013.01);
(Continued)

(58) Field of Classification Search
CPC ......... B82Y 10/00; B82Y 30/00; B82Y 40/00; H01L 21/3081; H01L 21/3085;
(Continued)

(56) References Cited

U.S. PATENT DOCUMENTS

| 6,586,874 B1 * | 7/2003 | Komoto | G02B 6/0023 257/100 |
| 8,043,942 B2 * | 10/2011 | Lee | H01L 21/0237 257/13 |

(Continued)

FOREIGN PATENT DOCUMENTS

| DE | 68924564 T2 | 3/1996 |
| DE | 102013111372 A1 | 4/2015 |
| WO | 2005017962 A2 | 2/2005 |
| WO | 2014066371 A1 | 5/2014 |

OTHER PUBLICATIONS

Manole, C. C., et al., "Evaluation of TiO2 Nanotubes Changes After Ultrasonication Treatment", Molecular Crystals and Liquid Crystals, vol. 521, 2010, pp. 84-92.

*Primary Examiner* — Edward Chin
(74) *Attorney, Agent, or Firm* — McDermott Will & Emery LLP (57) ABSTRACT

The invention relates to a method for laterally structuring a structured layer (2) with a plurality of three-dimensional structure elements (20), having the following steps: a) providing the structured layer with the three-dimensional structure elements; b) forming a laterally structured covering layer (3) on the structured layer in order to define at least one structured layer region (4) to be removed; and c) removing the structured layer region to be removed by means of a force acting on the structure elements in the region to be removed. The invention further relates to a semiconductor component (1).

9 Claims, 8 Drawing Sheets

(51) Int. Cl.
  *H01L 33/18*    (2010.01)
  *H01L 33/00*    (2010.01)
  *H01L 21/308*   (2006.01)
  *H01L 29/20*    (2006.01)
  *H01L 33/08*    (2010.01)
  *H01L 33/22*    (2010.01)
  *H01L 33/24*    (2010.01)

(52) U.S. Cl.
  CPC .......... *H01L 29/20* (2013.01); *H01L 33/0095* (2013.01); *H01L 33/18* (2013.01); *H01L 33/08* (2013.01); *H01L 33/22* (2013.01); *H01L 33/24* (2013.01); *H01L 2933/0016* (2013.01)

(58) Field of Classification Search
  CPC . H01L 21/3086; H01L 27/16; H01L 29/0676; H01L 31/035227; Y10T 428/24802; Y10T 428/249924; Y10T 428/2913
  See application file for complete search history.

(56) References Cited

U.S. PATENT DOCUMENTS

| | | | |
|---|---|---|---|
| 9,240,328 B2* | 1/2016 | Yi | B82Y 30/00 |
| 9,740,073 B2* | 8/2017 | Oh | G02F 1/153 |
| 9,797,567 B2* | 10/2017 | Kastner-Jung | B60Q 3/745 |
| 2005/0064185 A1* | 3/2005 | Buretea | B82Y 10/00 |
| | | | 428/364 |
| 2005/0167655 A1* | 8/2005 | Furukawa | B82Y 10/00 |
| | | | 257/20 |
| 2006/0151873 A1* | 7/2006 | Fery | G05B 19/41865 |
| | | | 257/712 |
| 2008/0297878 A1* | 12/2008 | Brown | B82Y 10/00 |
| | | | 359/263 |
| 2009/0091258 A1* | 4/2009 | Heuser | H01L 33/50 |
| | | | 313/512 |
| 2016/0141450 A1* | 5/2016 | Herner | H01L 33/0095 |
| | | | 257/13 |
| 2016/0233455 A1* | 8/2016 | Riedel | H01L 51/5203 |
| 2016/0266459 A1* | 9/2016 | Oh | G02F 1/153 |

* cited by examiner

METHOD FOR LATERAL PATTERNING OF A PATTERN LAYER WITH THREE-DIMENSIONAL PATTERN ELEMENTS, AND SEMICONDUCTOR DEVICE

CROSS-REFERENCE OF RELATED APPLICATIONS

This application is the U.S. National Phase under 35 U.S.C. § 371 of International Patent Application No. PCT/EP2015/060972, filed on May 19, 2015, which in turn claims the benefit of German Application No. 10 2014 107 167.0, filed on May 21, 2014, the entire disclosures of which Applications are incorporated by reference herein.

The present application relates to a method for lateral patterning of a pattern layer with a plurality of three-dimensional pattern elements, and to a semiconductor device with three-dimensional pattern elements.

Due to their enlarged surface area for example, three-dimensional nano- and micropatterns are distinguished by special characteristics and offer serious potential for different fields of use such as for example optoelectronics, sensor systems or microelectronics. However, such three-dimensional patterns display a distinctly greater topology, so making processing during the production of devices from such three-dimensional patterns more difficult. Planarization methods may be used to minimize topological influences. In this case, typically the topology is significantly overfilled and then the filler material is etched back. However, this may leave undesirable absorbing patterns behind. In addition, the method is for the most part only practicable in the case of small topological differences. Alternatively, patterning may be performed by back sputtering or dry or wet chemical etching. However, with such material removing methods the morphology of the pattern to be removed is often undesirably transferred at least in part into the underlying layers. In addition, wet chemical methods are limited with regard to the removable material and, moreover, often also with regard to the maximum quantity of material that can be removed.

Alternatively, the need for patterning three-dimensional patterns may be bypassed by producing three-dimensional patterns in a selective growth process. However, this reduces production flexibility, since the subsequent device sizes or types are predetermined at the point of growth. In addition, regions that remain free during the growth process can have an undesirable influence on said process.

One object is to provide a method with which three-dimensional patterns can be laterally patterned simply and reliably. Furthermore, it is intended to provide an easy-to-produce, reliable semiconductor device.

This object is achieved inter alia respectively by a method and a semiconductor device according to the independent claims. Configurations and further developments constitute the subject matter of the dependent claims.

According to one embodiment of a method for lateral patterning of a pattern layer with a plurality of three-dimensional pattern elements, the pattern layer with the three-dimensional pattern elements is provided. A laterally patterned covering layer is formed on the pattern layer to determine at least one region of the pattern layer to be removed. The region to be removed of the pattern layer is removed by means of a force acting on the pattern elements in the region to be removed.

The pattern elements are thus removed in that they are exposed to a force in the region to be removed which leads to breaking off of the pattern elements. In particular, the material of the pattern elements is not decomposed or removed sequentially in the vertical direction by means of a wet chemical or dry chemical method or a back sputtering method. For example, the pattern elements each break off as a solid body or as multiple solid bodies. For example, a volume of a one-piece part of a detached pattern element amounts to at least 30%, preferably at least 50% of the original pattern element.

A lateral direction here denotes a direction which extends along a main plane of extension of the pattern layer with the three-dimensional pattern elements. Accordingly, a vertical direction denotes a direction extending perpendicular to the main plane of extension.

Three-dimensional pattern elements are in particular regarded as pattern elements whose extent in the vertical direction is at least as great as the minimum extent in the lateral direction. For example, the pattern elements may have a columnar basic shape. A cross-section through the columnar pattern may in principle include any desired shapes. For example, a cross-section is polygonal, for instance quadrangular or hexagonal, or curved at least in places, for instance round or elliptical.

The region to be removed may contain a multiplicity of pattern elements, for example ten pattern elements or more, a hundred pattern elements or more or a thousand pattern elements or more.

The pattern elements in the region to be removed do not have to be completely removed. Rather, remnants of the pattern elements may also remain in the region to be removed. The smaller the vertical extent of these remnants, the simpler are subsequent process steps, since no edges have to be covered over. This may for example improve the adhesion of subsequently deposited layers. If the pattern layer with the three-dimensional pattern elements is used to produce radiation-generating semiconductor devices, maximally complete removal of the pattern layer in the region to be removed may then avoid the risk of radiation absorption through the pattern elements in this region. By dispensing with a dry chemical or wet chemical etching method for lateral patterning, it is furthermore possible to reduce damage to the patterns provided for radiation generation and to increase the area usable for radiation generation, since no underetching takes place during patterning. Furthermore, the method may be carried out very inexpensively and with short lead times.

In regions in which the laterally patterned covering layer has been formed on the pattern layer, the covering layer at least partly fills interspaces between adjacent pattern elements. The covering layer serves in particular as a temporary auxiliary layer for lateral patterning. After exposure to force, covering layer material remaining on the pattern layer may be removed. The covering layer may cover the pattern elements for example completely. In these regions, the pattern elements therefore do not project beyond the covering layer in a vertical direction. Alternatively, the pattern elements may also project in a vertical direction out of the covering layer. For example, the pattern elements may project at most by a proportion of 80% of their vertical extent out of the covering layer.

In one variant configuration, to form the laterally patterned covering layer, material for the covering layer is applied over the entire surface and subsequently patterned, for example using a photolithographic method.

In an alternative variant configuration, the material of the covering layer is applied ready-patterned. This may for example proceed using a mask or a printing method, for example an inkjet method.

The covering layer may for example contain a polymer material, for instance a photoresist material, a silicone, parylene or BCB.

According to one configuration of the method, the three-dimensional pattern elements have a maximum extent in at least one lateral direction of at most 5 µm. The maximum lateral extent may also be less than or equal to 1 µm. The smaller the three-dimensional pattern elements, the more pattern elements may be placed on the same area. This increases overall the surface area of the pattern layer.

According to a further configuration of the method, the extent of the pattern elements in the vertical direction is at least twice as great as the maximum extent in the lateral direction. The greater the aspect ratio, i.e. the ratio between vertical extent and lateral direction, the more easily the pattern elements can be broken off in the region to be removed using an applied force.

According to at least one embodiment of the method, the region to be removed is free of the covering layer. The covering layer thus serves as a protective layer which protects the regions not to be removed from the applied force. In the regions free of the covering layer, the applied force acts directly on the pattern elements and in particular causes mechanical breaking off of the pattern elements.

In one variant configuration, the applied force is exerted by a medium introduced with overpressure, for example a liquid, for instance water or a solvent, a gas, for instance air, or a particle jet, for instance a sand jet.

In one further variant configuration of the method, the applied force is exerted by mechanical wiping. The mechanical wiping proceeds, for example, by means of a brush or a cloth, for instance a cleaning cloth.

In one further variant configuration, the applied force is exerted by ultrasound.

In a further variant configuration of the method, the applied force is exerted by vibration. For example, the vibration frequency is conformed to a resonant frequency of the exposed pattern elements, such that the pattern elements break off due to the induced vibrations. The pattern elements embedded in the covering layer exhibit a modified resonant frequency due to the covering layer, such that no force sufficient for breaking off is exerted thereon.

According to at least one embodiment of the method, the region to be removed is covered by the covering layer. In particular, force is applied in this case to the pattern elements via the covering layer. For example, at least some of the pattern elements arranged adjacent one another in the region to be removed are connected together mechanically by way of the covering layer after removal.

In one variant configuration, the covering layer is peeled off together with the pattern elements in the region to be removed. The pattern elements embedded in the covering layer are thus exposed to a force by the peeling off which leads to the pattern elements breaking off in the region to be removed.

In an alternative variant configuration, the applied force is exerted by a thermally induced change in the extent of the covering layer, for example by thermal expansion through heating or thermal contraction through cooling. A temperature change, for instance heating of the covering layer, brings about mechanical stress on the pattern elements, such that they break off.

According to one embodiment, a semiconductor device comprises a pattern layer with a plurality of three-dimensional pattern elements, wherein, in plan view onto the semiconductor device, the pattern layer is subdivided into a device region and at least one stripped region. The stripped region comprises remnants of the pattern elements with breakage traces. The breakage traces are evidence of removal of the pattern elements by an applied force.

Breakage traces are formed, for example, at a surface which delimits the pattern elements in the vertical direction. The breakage trace may for example adopt the shape of a flat breakage edge.

The semiconductor device takes the form, for example, of an optoelectronic device, in particular an optoelectronic device provided for generating radiation, or of an electronic device, for example for sensor systems or microelectronics.

According to one configuration of the semiconductor device, the extent of the pattern elements in the vertical direction in the stripped region amounts to at most 30%, preferably at most 10% of the vertical extent of the pattern elements in the device region. The smaller the vertical extent of the pattern elements in the stripped region, the smaller is the risk of the patterns having an undesired negative effect, for example due to radiation absorption in the case of a radiation-generating semiconductor device.

In one configuration of the semiconductor device, the stripped region is a mesa trench. The stripped region for example delimits the device region of the pattern layer in the lateral direction, in particular over the entire circumference. To produce such a mesa trench, there is no need for wet chemical or dry chemical etching, which could damage the semiconductor device. Furthermore, in particular in contrast to conventional photolithographic patterning, it is ensured that the mesa trench does not split any pattern elements when viewed in plan view onto the semiconductor device.

In a further configuration of the semiconductor device, the stripped region is a region on which a contact area for external contacting is arranged. With a contact area which is applied not to the three-dimensional pattern elements but rather laterally of the three-dimensional pattern elements, the risk is also reduced of damage to the semiconductor device by uncontrollable breakage of the pattern elements on production of an external electrical connection, for example by means of a wire bond connection on the contact area.

In principle, the stripped region may however also be another region of the semiconductor device, in which the pattern layer is not desired or at least not necessary for operation of the semiconductor device.

In one configuration of the semiconductor device, the pattern elements comprise a first semiconductor layer of a first conduction type and a second semiconductor layer of a second conduction type different from the first conduction type, wherein the second semiconductor layer covers the side faces of the first semiconductor layer at least in places. An active region provided for generating radiation may be formed in a pn junction between the first semiconductor layer and the second semiconductor layer. Such a semiconductor device is distinguished, due to the three-dimensional pattern elements, by a particularly large area of the active region usable for generating radiation.

In one configuration of the semiconductor device, the pattern layer comprises a semiconductor material, in particular a III-V compound semiconductor material.

III-V compound semiconductor materials are particularly suitable for generating radiation in the ultraviolet ($Al_x In_y Ga_{1-x-y} N$) through the visible ($Al_x In_y Ga_{1-x-y} N$, in particular for blue to green radiation, or $Al_x In_y Ga_{1-x-y} P$, in particular for yellow to red radiation) as far as into the infrared ($Al_x In_y Ga_{1-x-y} As$) region of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V compound semiconductor materials, in particular from the stated material systems, it is additionally possible to achieve high internal quantum efficiencies in the generation of radiation.

The pattern layer may however also contain a II-VI compound semiconductor material or a group IV semiconductor material, for example Si or Ge.

BRIEF DESCRIPTION OF THE FIGURES

The above-described method for lateral patterning is particularly suitable for production of the described semiconductor device. Features listed in connection with the semiconductor device may therefore also be used for the method and vice versa. Further features, configurations and convenient aspects are revealed by the following description of the exemplary embodiments in conjunction with the figures, in which.

Identical, similar or identically acting elements are provided with the same reference numerals in the figures.

The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

Figure 1A:
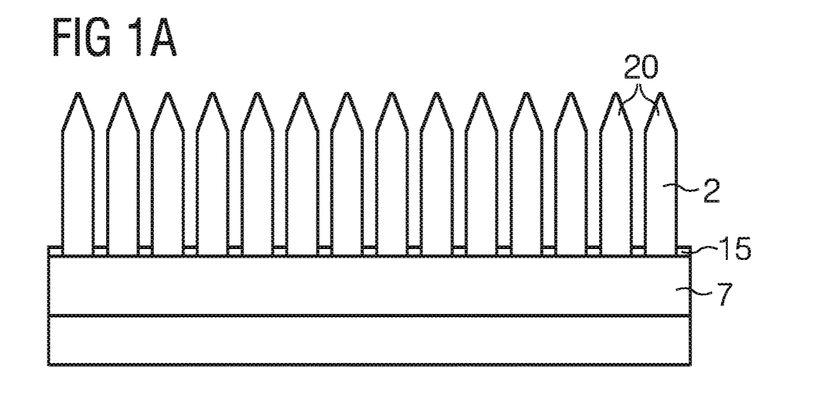
FIGS. 1A to 1E and FIGS. 2A to 2F each show a first or second exemplary embodiment respectively of a method by way of intermediate steps shown schematically in sectional view.

FIGS. 1A to 1E show a first exemplary embodiment of a method for lateral patterning by way of a portion in schematic sectional view. As shown in FIG. 1A, a pattern layer 2 with a plurality of three-dimensional pattern elements 20 is provided. For example, the pattern layer 2 is arranged on a carrier 7. The carrier may for example be a growth substrate for epitaxial deposition of the material of the pattern layer 2. Alternatively, the carrier may also be different from a growth substrate for the pattern layer. The pattern layer may comprise a semiconductor material, in particular a III-V compound semiconductor material. The pattern elements 20 may arise as early as during in particular epitaxial deposition of the pattern layer or through subsequent patterning of a planar layer to form three-dimensional patterns.

The pattern elements 20 may be arranged in particular regularly, for example in a matrix or in a hexagonal pattern. The position of the pattern elements may for example be determined by means of a mask layer 15. Alternatively, the pattern elements may also be arranged irregularly, in particular randomly, for example as a result of self-organized growth. The mask layer may then be omitted. Remnants of the mask layer which may optionally be present may be removed during the method or in a post-processing step or remain on the carrier.

In the lateral direction the pattern elements 20 preferably have a maximum extent of 5 μm. The pattern elements may however also be smaller or larger. For example, the maximum lateral extent in at least one lateral direction is at most 1 μm.

In a vertical direction, i.e. perpendicular to a main plane of extension of the pattern layer 2, the extent is at least as great as the maximum lateral extent, preferably at least twice as great as the maximum lateral extent.

Figure 1B:
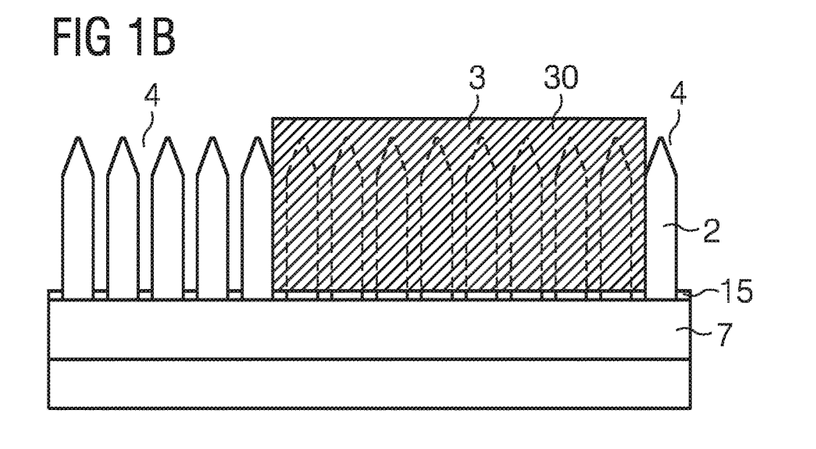

A covering layer 3 is formed on the pattern layer 2. For example, the covering layer comprises a polymer material. The covering layer fills the interspaces between adjacent pattern elements 20. In the exemplary embodiment shown, a material 30 for the covering layer is applied already laterally patterned to the pattern elements 20. This may proceed for example by means of a mask, for instance a shadow mask, or by means of a method suitable for laterally patterned application, for example a printing method, for instance an inkjet printing method. In the regions in which the covering layer 3 is formed, the latter does not have to cover the pattern elements 20 completely in the vertical direction. It may also be sufficient merely for the bottom ends of the pattern elements 20 to be embedded in the covering layer.

The covering layer 3 forms a protective layer for the pattern elements 20 covered by the covering layer. Laterally of the covering layer 3, regions 4 to be removed, in which the pattern elements 20, in particular also the bottom ends of the pattern elements, are exposed, are defined by means of the covering layer 3 (FIG. 1B).

Figure 1C:
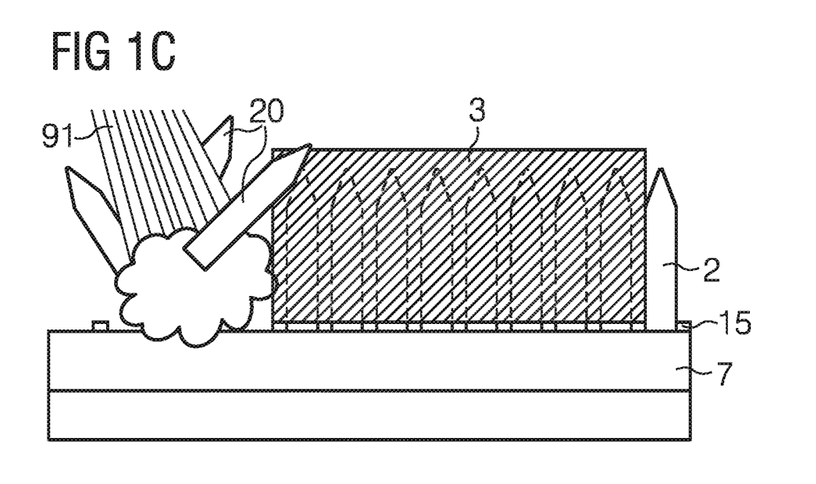

The pattern elements 20 are then exposed to a force in the regions to be removed 4, such that the pattern elements 20 break off in the regions to be removed. In the exemplary embodiment shown, the applied force is exerted by a medium introduced with overpressure, for example air, water or a solvent or by means of a particle jet, for instance a sand jet. FIG. 1C shows, by way of example, a jet 91 for mechanical application of force.

Alternatively, the applied force may also be exerted by mechanical wiping, by ultrasound or by vibration.

A sufficiently heavy application of force, exerted in particular obliquely relative to the vertical direction, results in the free-standing pattern elements 20 not protected by the covering layer 3 being broken off. The pattern elements 20 to be removed are removed as solid bodies. For example, the volume of a one-piece part of the removed pattern element amounts to at least 30%, preferably at least 50%, of the volume of the original pattern element.

In particular, the local application of force results in shear forces on the side faces of the pattern elements 20, which are at their greatest at the bottom end of the pattern elements 20. In this way, the pattern elements 20 break off, preferably at the bottom end, such that the vertical extent of the remnants of the pattern elements 20 remaining on the carrier is slight. The bottom end is considered to be the end of the pattern elements 20 facing the carrier 7. Preferably, after removal the extent of the pattern elements in the region to be removed amounts to at most 10%, particularly preferably at most 5%, of the non-stripped pattern elements 20.

Figure 1D:
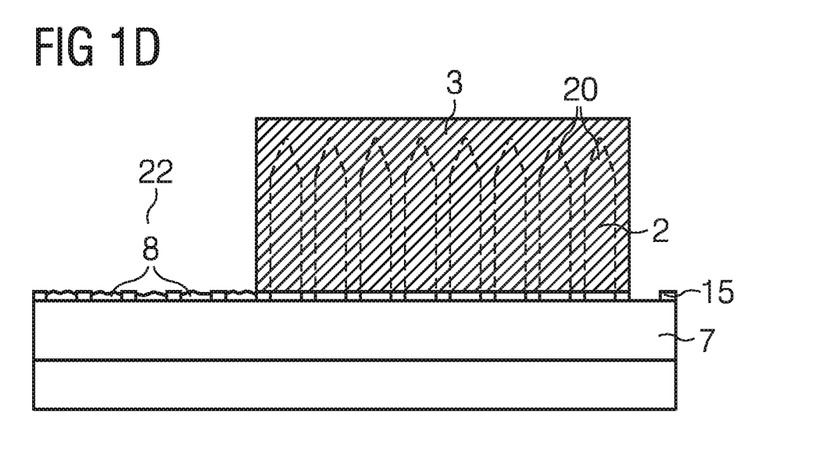

Thus, only the pattern elements 20 embedded in the covering layer 3 remain on the carrier 7 (FIG. 1D).

Figure 1E:
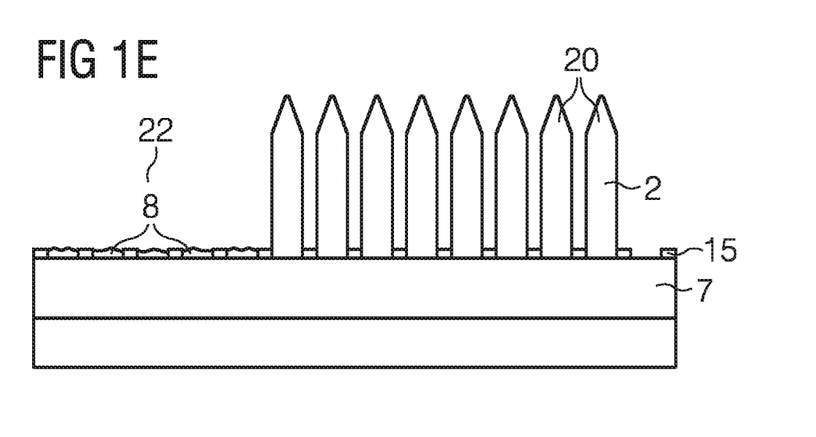

The covering layer can then be removed, such that the pattern layer 2, as shown in FIG. 1E, is present in laterally patterned form, with a stripped region 22 of the pattern layer 2. Such a pattern layer may subsequently be further processed into semiconductor devices. The stripped region 22 may for example be a mesa trench of the semiconductor device or a region on which a contact area for external contacting is arranged. During further processing, it is for example possible further to process the stripped regions in a post-processing step, for example using a chemical method, for instance etching. As a result of the preceding formation of the stripped regions, such a post-processing step is simplified, since the region to be treated has reduced topological height differences.

In the stripped region 22, breakage traces 8 may remain as a consequence of the mechanical stripping.

The described method is largely independent of the material of the pattern layer 2 and is therefore suitable in particular for different semiconductor materials, in particular for the semiconductor materials stated in the general part. Furthermore, the resultant pattern is less heavily dependent on the morphology of the initial pattern of the pattern layer 2, in particular compared with a method in which the pattern layer is patterned by an etching method. In addition, the pattern elements 20 do not necessarily have to have the same height. The method is also suitable for simultaneous removal of pattern elements of different heights. In contrast, in a chemical method etching periods of different lengths would be necessary for the stripping of pattern elements of different heights.

Furthermore, it is possible for the lateral patterning not to take place until after formation of the pattern layer 2. It is thus not necessary to predetermine the geometric shape of the semiconductor devices, for example the grid, the size and/or the type of the semiconductor devices, by way of a specific growth mask for epitaxy of the pattern layer. In addition, it is simply and reliably ensured by means of the method that during lateral patterning no pattern elements 20 are split. It has been found that, by avoiding splitting of pattern elements, the aging resistance of the semiconductor devices to be produced can be increased. In the case of chemical removal of the pattern elements in the region 4 to be removed, on the other hand, at best very precise, complex adjustment for the lithography method might prevent splitting of individual pattern elements.

The second exemplary embodiment shown in FIGS. 2A to 2F corresponds substantially to the first exemplary embodiment described in connection with FIGS. 1A to 1E. At variance therewith, the material 30 of the covering layer 3 is first applied over the entire surface (FIG. 2B) and then laterally patterned, for example by means of a mask 95. The mask 95 may for example be formed by a photoresist.

Figure 2A:
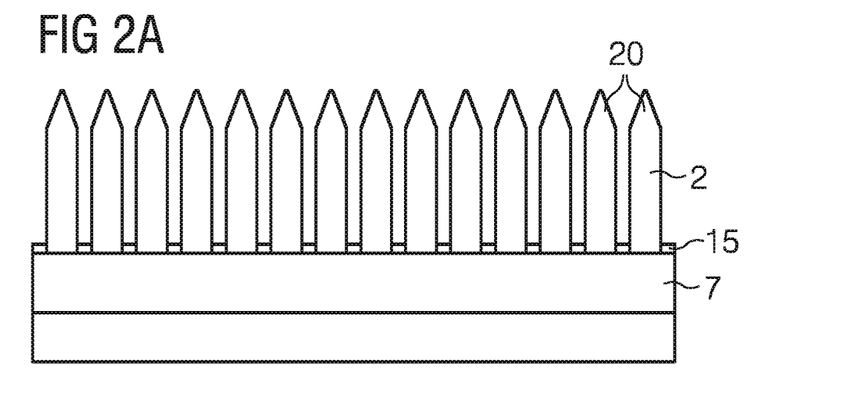
Figure 2B:
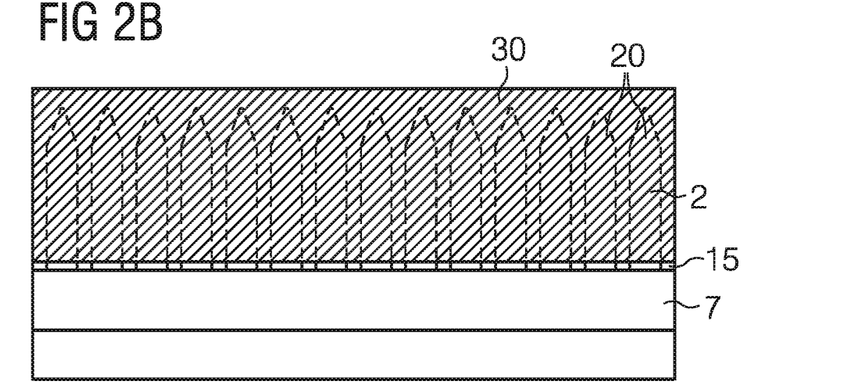
Figure 2C:
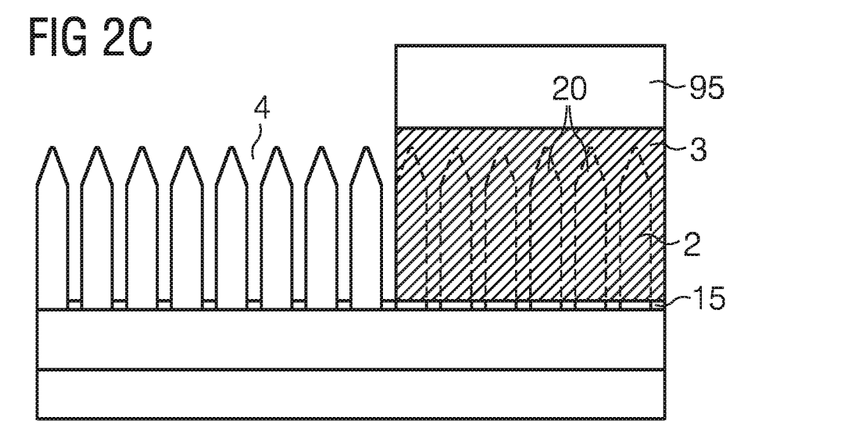
Figure 2D:
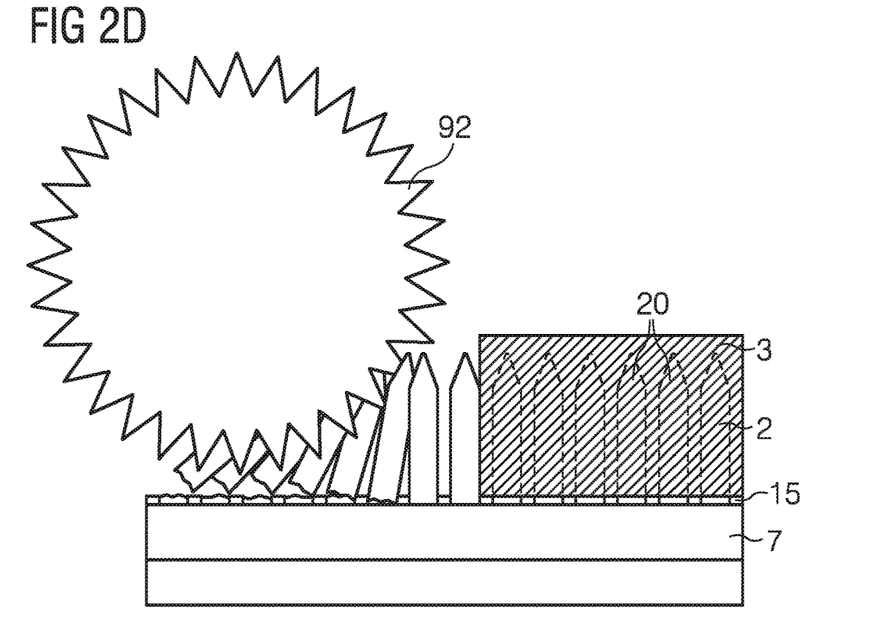

Then, as shown in FIG. 2D, force is applied in the regions 4 to be removed. This takes place by way of example in FIG. 2D by means of a brush 92. It may however also be performed by another type of mechanical wiping, for example by means of a cloth, for instance a cleaning cloth. Furthermore, one of the other methods mentioned in connection with FIG. 1C can also be applied.

Figure 2E:
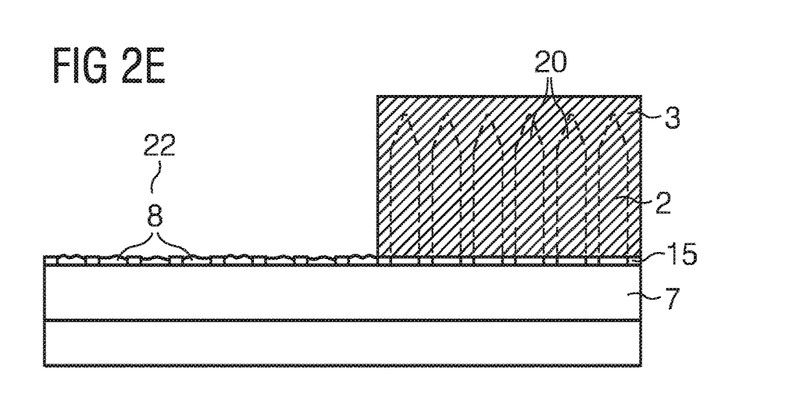
Figure 2F:
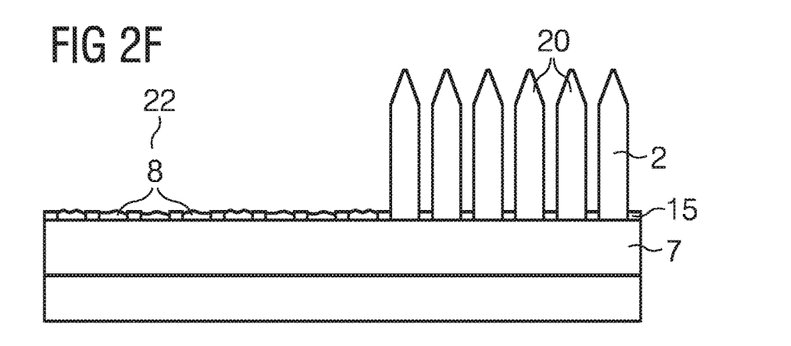

After a cleaning step, only the pattern elements 20 embedded in the covering layer 3 remain on the carrier 7 (FIG. 2E). The covering layer 3 may then be removed as shown in FIG. 2F, so resulting in a laterally patterned pattern layer 2.

Figure 3A:
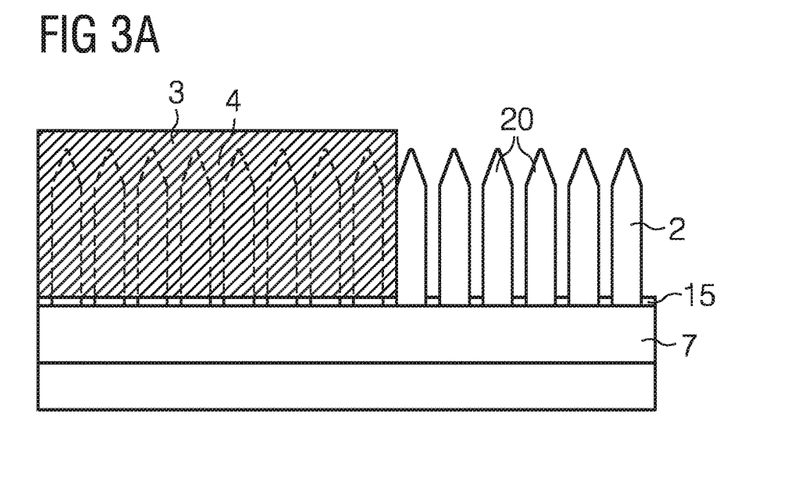
FIGS. 3A to 3D show a third exemplary embodiment of a method by way of intermediate steps in sectional view (FIGS. 3A to 3C) and in plan view (FIG. 3D)
Figure 3B:
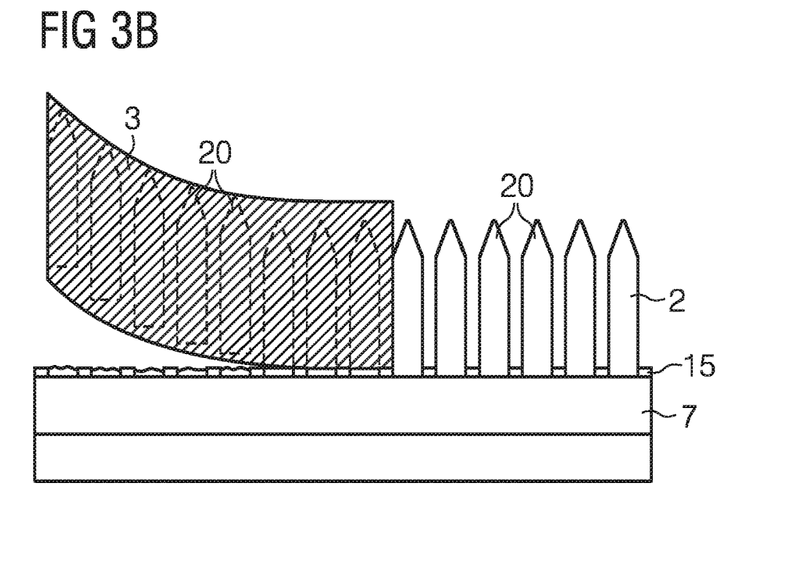
Figure 3C:
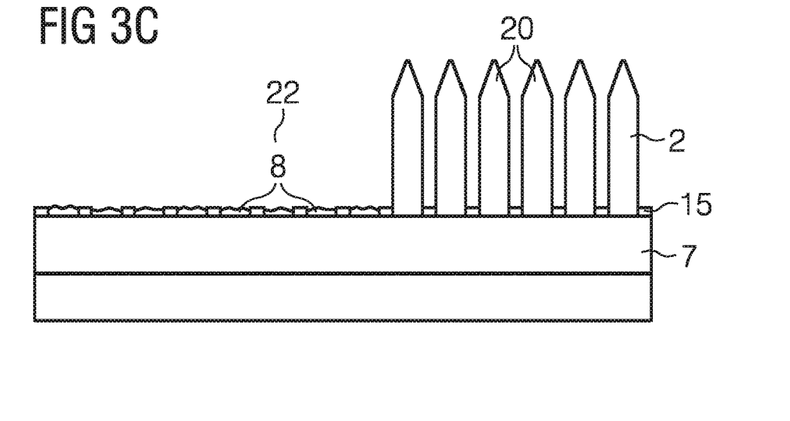

The third exemplary embodiment shown in FIGS. 3A to 3C differs from the first and second exemplary embodiments in that the regions 4 to be removed are those regions which are covered by the covering layer 3 (FIG. 3A). The regions not to be removed may additionally be embedded in a protective layer (not explicitly illustrated).

As shown in FIG. 3B, the applied force does not act directly on the pattern elements 20, but rather is transferred in places to the pattern elements 20 via the covering layer 3. For example, a matrix material, for instance a silicone matrix into which the pattern elements 20 have been embedded in the region 4 to be removed, is suitable for the covering layer.

The pattern elements 20 not covered by the covering layer do not, on the other hand, undergo any application of force or at least none sufficient to break off the pattern elements 20.

Figure 3D:
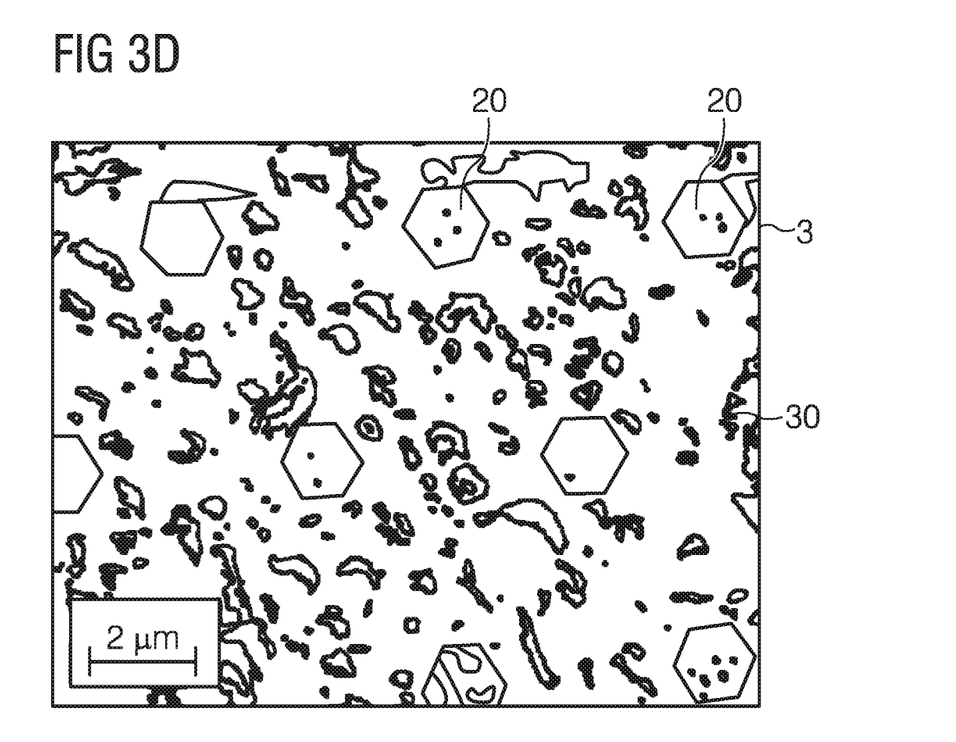

FIG. 3D shows a portion of a peeled-off material 30 in the form of a silicone matrix. In this exemplary embodiment, the pattern elements 20 embedded in the material have a hexagonal basic shape and are arranged in a hexagonal pattern. It goes without saying, however, that the method is also suitable for pattern elements with other basic shapes and other relative arrangements.

The method again results, as shown in FIG. 3C, in a stripped region 22 of the pattern layer 2.

Figure 4A:
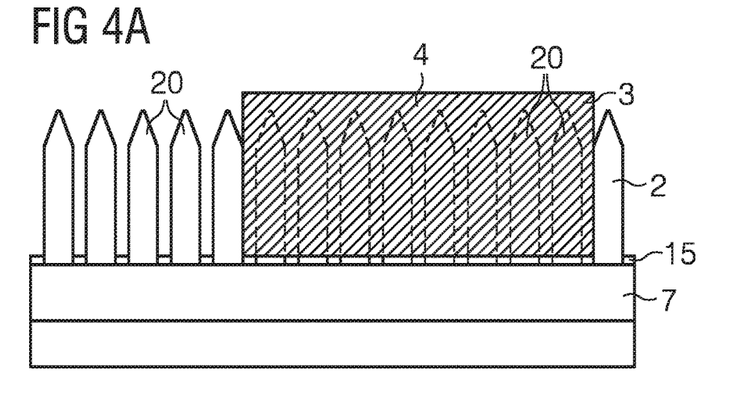
FIGS. 4A to 4C show a fourth exemplary embodiment of a method by way of intermediate steps shown schematically in sectional view.
Figure 4B:
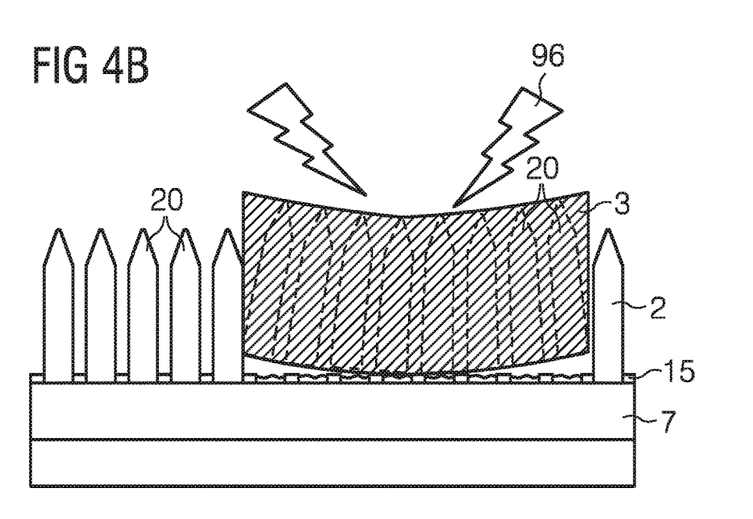
Figure 4C:
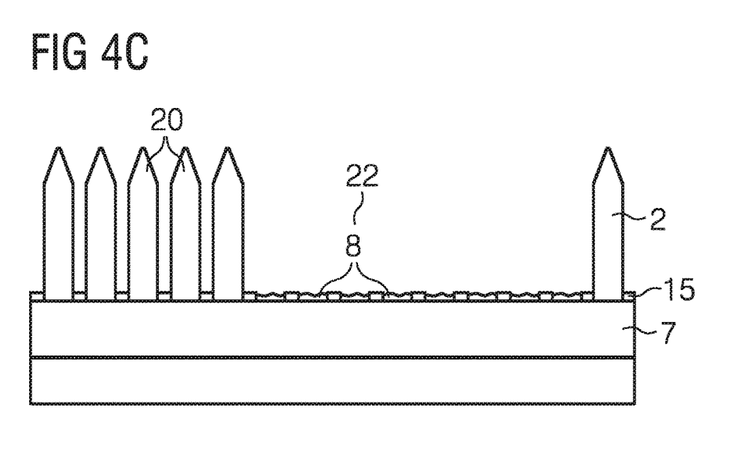

The fourth exemplary embodiment shown in FIGS. 4A to 4C corresponds substantially to the third exemplary embodiment described in connection with FIGS. 3A to 3D. The region 4 to be removed is in particular once again that region of the pattern layer 2 which is covered by the covering layer 3 (FIG. 4A). However, the applied force is exerted by a thermally induced change in the extent of the covering layer. This may proceed for example by means of heating, shown in FIG. 4B by arrows 96. To this end, the material of the covering layer 3 conveniently has as large as possible a coefficient of thermal expansion, which differs from coefficients of expansion of the pattern layer 2. For example, the coefficient of thermal expansion of the covering layer is at least 50% greater than the coefficient of thermal expansion of the material of the pattern layer 2. As a result of the temperature change, mechanical stresses arise which cause the pattern elements 20 to break off in the region 4 to be removed. The pattern layer 2 patterned laterally in this way is shown in FIG. 4C.

Figure 5A:
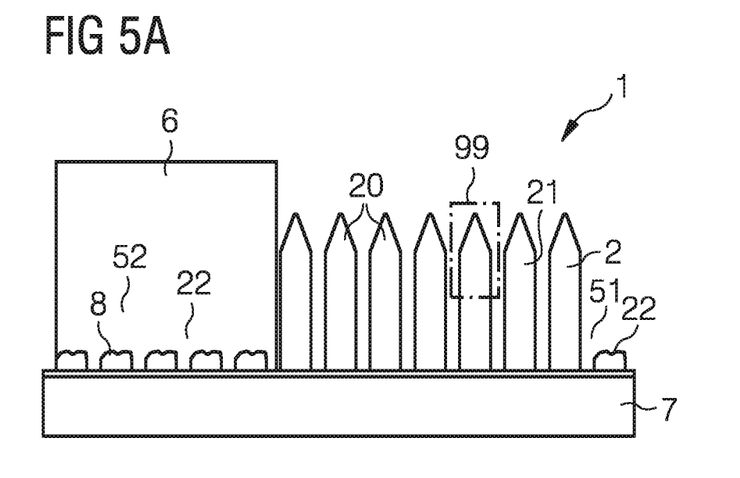
FIGS. 5A and 5B show an exemplary embodiment of a semiconductor device in schematic sectional view (FIG. 5A) with an enlarged representation of a portion in FIG. 5B.

An exemplary embodiment of a semiconductor device is shown in schematic sectional view in FIG. 5A. A portion 99 is shown on an enlarged scale in FIG. 5B. The semiconductor device 1 comprises a pattern layer 2 with a plurality of three-dimensional pattern elements 20. In plan view onto the semiconductor device, the pattern layer is subdivided into a device region 21 and stripped regions 22. The stripped regions 22 each comprise remnants of the pattern elements with breakage traces 8. The lateral extent of the pattern elements 20 is shown exaggeratedly large. The device region 21 typically comprises a multiplicity of such pattern elements, for example a hundred pattern elements or more.

By way of example, the semiconductor device 1 comprises two stripped regions 22, wherein one of the stripped regions takes the form of a mesa trench 51. The above-described method ensures that, in plan view onto the semiconductor device, the mesa trench does not split any pattern elements 20.

A further stripped region 22 takes the form of a region 52, in which a contact area 6 is arranged for external electrical contacting of the semiconductor device, for example by means of a wire bond connection. No tall edges have to be covered over to form the contact area. The absence of pattern elements 20 in the stripped region 22 additionally ensures that, during production of the wire bond connection, no pattern elements arranged beneath the contact area 6 break and have a disadvantageous effect on the functionality of the semiconductor device.

Figure 5B:
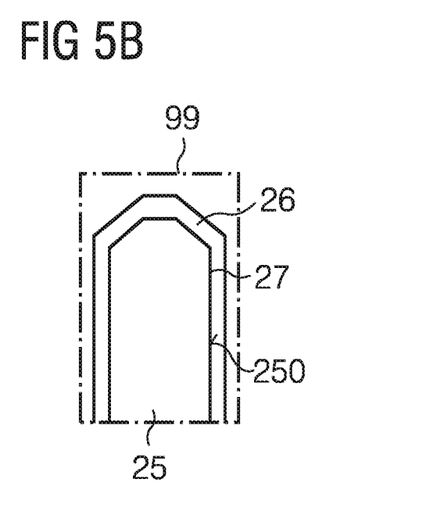

The semiconductor device 1 illustrated is configured, by way of example, as a semiconductor device provided for generating radiation. A nitride compound semiconductor material, in particular $Al_x In_y Ga_{1-x-y} N$, is for example suitable for the generation of ultraviolet or blue radiation. The pattern elements 20 each comprise a first semiconductor layer 25 of a first conduction type and a second semiconductor layer 26 of a second conduction type different from the first conduction type. For example, the first semiconductor layer 25 is n-conductive and the second semiconductor layer 26 p-conductive or vice versa. An active region 27 provided for generating radiation is formed between the first semiconductor layer 25 and the second semiconductor layer 26. The second semiconductor layer 26 also covers, at least in places, the side faces 250 of the first semiconductor layer 25. In this way, the area of the active region 27 usable for generating radiation is increased in comparison with two first and second semiconductor layers deposited flat one over the other. The pn junction between the first semiconductor layer 25 and the second semiconductor layer 26 does not have to be exposed to produce the semiconductor device, in particular neither for external electrical contacting nor for formation of the mesa trenches.

The risk of an electrical short-circuit due to an exposed region of the first semiconductor layer 25 resulting from a broken-off pattern element is prevented. By avoiding splitting of the pattern elements 20, it is moreover ensured that the pn junction between the first semiconductor layer 25 and the second semiconductor layer 26 is short-circuited in the mesa trench.

It goes without saying that the semiconductor device may also have just one stripped region or three or more stripped regions. Furthermore, unlike in the described exemplary embodiment, the semiconductor device may also take the form of another semiconductor device, for example a sensor or a microelectronic or micromechanical device. In general, the described method is suitable for producing devices in which lateral patterning of a pattern layer with three-dimensional pattern elements is desired.

When producing the semiconductor devices, the stripped regions may be further processed in a post-processing step. For example, an etch step may be performed by which the mesa trenches 51 are formed right down to the carrier 7. The previously performed method for forming the stripped regions simplifies such a post-processing step, since the surface to be treated has less pronounced topological differences.

This patent application claims priority from German patent application 10 2014 107 167.0, the disclosure content of which is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or the exemplary embodiments.

The work leading to this invention has received funding from the European Union under grant agreement no NMP3-SL-2012-280694.

The invention claimed is:

1. A method for producing a semiconductor device comprising a pattern layer with a plurality of three-dimensional pattern elements, having the steps:
    a) provision of the pattern layer with the three-dimensional pattern elements;
    b) formation of a laterally patterned covering layer on the pattern layer to determine at least one region to be removed of the pattern layer; and
    c) removal of the region to be removed of the pattern layer by means of a force acting on the pattern elements in the region to be removed, so that the pattern elements in the region to be removed break and the pattern layer in a top view is subdivided in a device region and a stripped region,
    wherein the pattern layer is provided on a substrate in step a),
    wherein in step c), the region to be removed of the pattern layer is removed from the substrate, and
    wherein the semiconductor device comprises the device region of the pattern layer on the substrate.

2. The method according to claim 1, wherein the three-dimensional pattern elements have a maximum extent in at least one lateral direction of at most 5 μm.

3. The method according to claim 2, wherein the extent of the pattern elements in a direction perpendicular to the lateral direction is at least twice as great as the maximum extent in the lateral direction.

4. The method according to claim 1, wherein in step b) the region to be removed is free of the covering layer.

5. The method according to claim 4, wherein the applied force is exerted by a medium introduced with overpressure or by mechanical wiping.

6. The method according to claim 4, wherein the applied force is exerted by ultrasound or vibration.

7. The method according to claim 1, wherein in step b) the region to be removed is covered by the covering layer.

8. The method according to claim 7, wherein the covering layer is peeled off together with the pattern elements in the region to be removed.

9. The method according to claim 7, wherein the applied force is exerted by a thermally induced change in extent of the covering layer.

* * * * *